United States Patent

Ohsawa et al.

[15] 3,665,320

[45] May 23, 1972

[54] GATE CIRCUIT

[72] Inventors: Mitsuo Ohsawa, Fujisawa; Shinziro Mino, Tokyo, both of Japan

[73] Assignee: Sony Corporation, Tokyo, Japan

[22] Filed: July 7, 1970

[21] Appl. No.: 52,954

[30] Foreign Application Priority Data

July 11, 1969 Japan....................................44/55240

[52] U.S. Cl................................................325/478, 307/251

[51] Int. Cl............................................................H04b 1/16

[58] Field of Search..................325/478, 473, 480; 307/239, 307/251

[56] References Cited

UNITED STATES PATENTS

| | | | |
|---|---|---|---|
| 3,374,437 | 3/1968 | Heald | 325/478 |
| 3,509,468 | 4/1970 | Overlie | 325/478 |
| 3,550,012 | 12/1970 | Paul | 325/478 |

OTHER PUBLICATIONS

Klein, Electronic Communicator P. 8 Vol. 12 No. 5 Sept.–Oct. 1967

*Primary Examiner*—Robert L. Richardson
*Attorney*—Hill, Sherman, Meroni, Gross & Simpson

[57] ABSTRACT

A gate circuit utilizing a field effect transistor which has very rapid turn-off and turn-on time so that it may be used as a muting or squelch circuit in a communication system, for example.

7 Claims, 4 Drawing Figures

Patented May 23, 1972 3,665,320

2 Sheets-Sheet 1

INVENTOR.

MITSUO OHSAWA
SHINZIRO MINO

BY Hill, Sherman, Meroni, Gross & Simpson ATTORNEYS

Patented May 23, 1972 3,665,320

2 Sheets-Sheet 2

INVENTORS

MITSUO OHSAWA

SHINZIRO MINO

BY Hill, Sherman, Meroni, Gross & Simpson ATTORNEYS

GATE CIRCUIT

BACKGROUND OF THE INVENTION

1. Field of the Invention

This invention generally relates to a gate circuit and more particularly to an improved gate circuit employing a field effect transistor.

2. Description of the Prior Art

A field effect transistor (FET) has been used to form a gate circuit. However, such circuits have had slow response times.

Generally, the FET element has a conduction characteristic such that the current between the drain and source increases with changes in the gate voltage. When the gate voltage is lower than the pinchoff voltage (usually between −2 to −4 volts) the FET element is nonconductive between the drain and source. When the gate voltage exceeds the pinchoff voltage the FET element is conductive between the drain and source and the current increases substantially in proportion to the gate voltage. Thus, the FET can be used as a switch by changing the gate voltage between a voltage lower than the pinchoff voltage and a voltage higher than the pinchoff voltage. For example, the gate voltage might be changed from −3 volts to zero volts to obtain gating.

A gate circuit formed with an FET in a switching circuit normally receives an input signal on the drain through a capacitor. The output signal is taken from the source through a capacitor and a control signal is applied to its gate. With an N-channel FET, the gate control signal is generally selected to be about ground potential and a bias voltage is applied to the source which is a little greater than that at which the transistor is pinched off.

If such a gate circuit is used in an electronic instrument when a power source switch is closed, the bias potential on the source of the FET supplied from a power source circuit rises exponentially at a rate depending upon the time constant of the power source circuit. The FET will remain conductive until the source potential approaches the voltage which pinches off the FET. During this time charge is transferred between the source and drain of the FET and stored in the capacitor on the input side. When the source potential has reached the turn-off voltage, the charge stored in the capacitor is gradually discharged because of nonconduction of the FET and makes noise. Consequently, such a circuit cannot be used as a muting or squelch circuit.

SUMMARY OF THE INVENTION

The present invention provides an FET gating circuit which is not subject to noise and may be used as a muting or squelch circuit in a communication equipment. The bias signals are applied to the source and drain of the FET in a manner which prevents discharge of an input capacitor and thus noise is prevented.

The primary object of this invention is to provide a gate circuit employing an FET which is free from noise such as occurs in prior art devices.

Another object of this invention is to provide a gate circuit employing an FET which is substantially free from the influence of switching of a power source.

Still another object of this invention is to provide a gate circuit employing an improved FET which may be used in a muting circuit.

Other objects, features and advantages of this invention will become apparent from the following description taken in conjunction with the accompanying drawings.

DESCRIPTION OF THE PREFERRED EMBODIMENTS

With reference to the drawings, this invention will hereinafter be described in detail.

Figure 3:
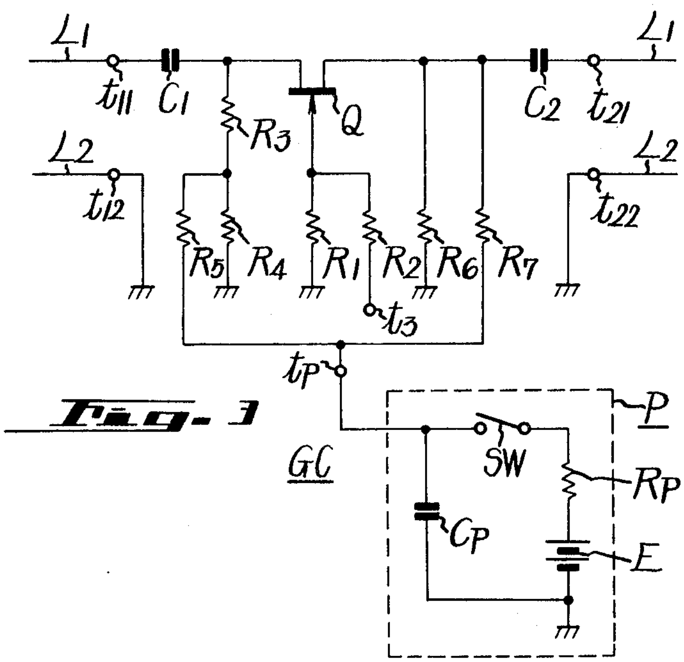
FIG. 3 is a circuit diagram schematically showing one example of a gate circuit of this invention.

FIG. 3 illustrates an example of the invention. A pair of input signal transmission lines L1 and L2 are connected to input terminals *t*11 and *t*12. Input terminal *t*12 is connected to ground. The gate circuit GC of the invention is connected in the signal transmission path and includes an FET field effect transistor Q which has its drain connected to input terminal *t*11 through capacitor C1 and its source connected to output terminal *t*21 through a capacitor C2. A pair of output signal transmission lines L1 and L2 are respectively connected to output terminals *t*21 and *t*22. Output terminal *t*22 is connected to ground. The gate of the FET Q is connected to ground through a resistor R1. The gate is also connected to a control signal input terminal *t*3 through a resistor R2. A power source circuit P includes a battery E which has its negative electrode connected to ground and its positive terminal connected to a power source switch SW through a resistor Rp. A power source output terminal *tp* is connected to the other side of the switch SW. A capacitor Cp is connected between ground and the output terminal *tp*.

The drain of the FET Q is connected to ground through series resistors R3 and R4 and the source is connected to ground through a resistor R6. The power source output terminal *tp* is connected through resistor R5 to the junction point of the resistors R3 and R4 and is also connected to the source of the FET Q through a resistor R7.

In the present invention the bias potential applied from the battery E to the source and drain through the resistors Rp, R5, R3 and R7, are substantially equal. The impedance of the resistors R3, R4, R5 is chosen so that a sufficiently high impedance is obtained for signals applied to input terminals *t*11 and *t*12 and in a particular example the values of resistors R4 and R6 are 360 kilohms and the impedance of resistors R3, R5 and R7 was 1 megohm. By selecting resistor R3 with an impedance value of 1 megohm the input impedance of the gate circuit GC is greater than the output impedance. In the circuit constructed according to this example the pinchoff voltage (the cut-off voltage) Vp was −3.5 volts. Operating voltage of 4 volts are supplied from the power source P to the source and drain of the FET Q. When no signal is applied to the gate input terminal *t*3, the FET Q is in the off state.

Figure 1:
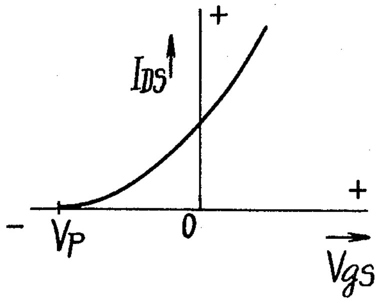
FIG. 1 is a graph showing a characteristic of one example of an FET.
Figure 2:
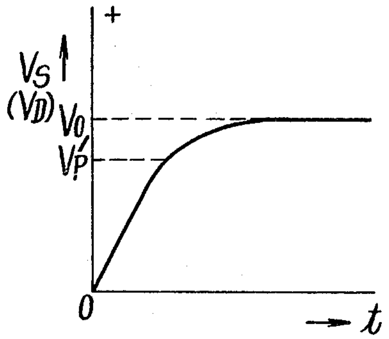
FIG. 2 is a graph for explaining this invention.

In operation, when the power source switch SW is closed, the voltage at terminal *tp* rises with a time constant $t - CpRp$, ($Cp$ and $Rp$ being respectively the capacitance of the capacitor Cp and the resistance of the resistor Rp). Thus, voltage applied to the source and drain of the FET Q designated as $V_S$ and $V_D$, respectively, also vary with time t as illustrated in FIG. 2. For example, if the power source switch is closed at $t = 0$, the source and drain potential $V_S$ and $V_D$ gradually increase to a predetermined value $V_0$ (for example, 4 volts at a rate dependent upon the time constant of the power source and then remain at that value. The FET Q will be in the on state during the time that the potentials at the source and drain $V_S$ and $V_D$ passes from zero to Vp' (=|Vp|)(for example, 3.5 volts). The FET Q will be in the off state when the voltages on the source and drain are above the value of Vp'. During the time that the FET Q is in the on state the source and drain potentials rise equally to the predetermined value $V_0$ and there is negligible transfer of charge between the source and drain of the FET Q and the capacitor C1 between the drain and the input terminal *t*11 will have substantially zero charge.

Thus, in the gate circuit of this invention no discharge from the input capacitor C1 will occur when the FET Q is turned off and thus noise will not be generated when the power source switch SW is closed.

The equivalent resistances of the resistors on the input and the output sides of the FET Q are selected to be large enough to prevent a drop in signal level in the transmission lines L1 and L2.

Figure 4:
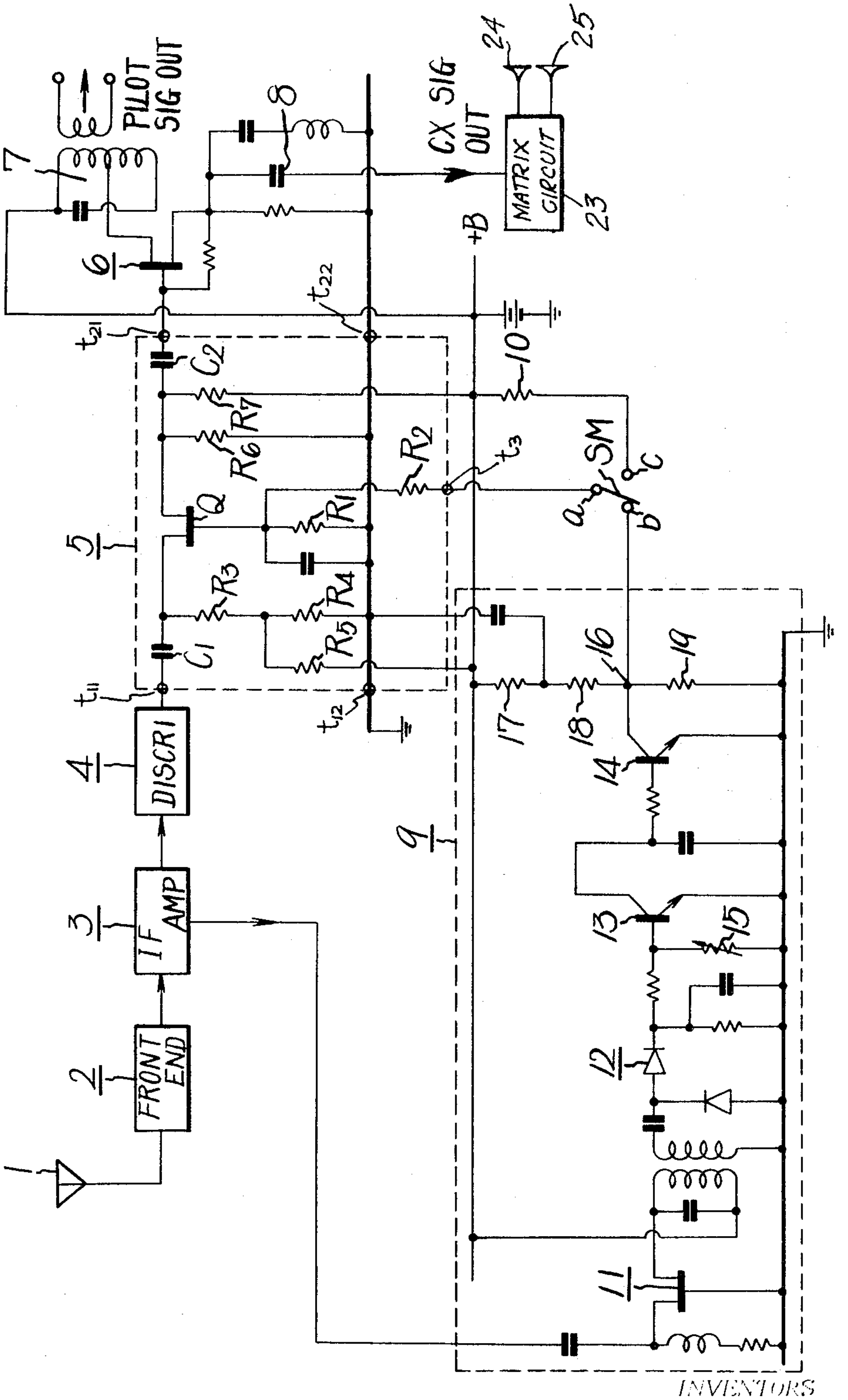
FIG. 4 is a circuit diagram schematically illustrating one example of a muting circuit with the gate circuit of this invention mounted therein.

FIG. 4 illustrates the gate circuit of the invention connected in circuit with a stereophonic receiver as a muting circuit.

In the gate circuit designated by numeral 5 in FIG. 4 the components are designated by the same reference characters as in FIG. 3.

An antenna 1 receives an incoming signal and supplies it to the front end 2 of an FM receiver which converts the incoming signal to a suitable IF and supplies it to an IF amplifier 3. A frequency discriminator 4 receives the output of the IF amplifier 3 and supplies an input to input terminal *t11* of the gating circuit of the invention designated by numeral 5. The output terminal *t21* of the gating circuit 5 is connected to an amplifier 6 which might be an FET. The pilot signal tone is removed by circuit 7 and the composite stereophonic signals are applied through capacitor 8 to a matrix circuit 23 which has left and right output speakers 24 and 25.

In the sound reproducing circuits of FM multiplex receivers such as illustrated, when the input signal level is lower than a predetermined value, noise increases and muting circuits are provided for disconnecting the signal transmission lines from the output circuit. In the present invention the gating circuit 5 similar to the gating circuit illustrated in FIG. 3 is utilized for muting operations so as to switch the signal transmission lines off and on.

An intermediate frequency signal detector circuit for the muting operation is designated generally by numeral 9. The circuit 9 detects the intermediate frequency signal level and produces a signal indicative of the detected level which is utilized to control the gate circuit 5. The input to the gating circuit 5 is supplied through a muting switch SM which has a movable contact *a* which is connected to the resistor R2 through the gate input terminal *t3*. When the movable contact of switch SM is in engagement with contact *b* of the switch, the output of the detector circuit 9 is applied to the gate circuit of the transistor Q. The movable contact *a* may be placed in engagement with a contact *c* that connects it to a fixed bias source B+ through a resistor 10 to provide a fixed gate bias to the transistor Q. When the contact *a* is in engagement with contact *c* no muting operation is performed in the circuit of FIG. 4.

The intermediate frequency signal detector circuit 9 receives an input from IF amplifier 3 and amplifies it with an amplifier 11 and supplies it to a detector-rectifier circuit 12 which produces a gating potential for a transistor 13 which receives the output of the detector-rectifier circuit 12 on its base. A variable resistor 15 is connected between base and ground of the transistor 13 and allows the level at which transistor 13 turns on to be controlled. The collector of transistor 13 is coupled to a transistor 14 which has its emitter connected to ground and its collector connected to contact *b* of switch SM. Resistors 17, 18 and 19 are connected in series between B+ and ground and the junction point between resistors 18 and 19, designated by numeral 16, is connected to the collector of transistor 14.

In operation if contact *a* is in engagement with the contact *c* a fixed bias is applied through resistor 10 to the input gate terminal t3 and no muting action is provided by the circuit of FIG. 4. When the contact *a* is moved to engage contact *b* of switch SM the gate 5 will be controlled by the output of the detector circuit 9 and muting action will occur when necessary.

If a sufficiently high level signal is supplied from the IF amplifier 3 to the detector circuit 9 it will be amplified, detected and rectified and applied to the base of transistor 13 to turn transistor on thus reducing the potential on the base of transistor 14 to turn it off. When the transistor 14 is turned off, resistors 17, 18 and 19 provide a voltage divider between B+ and ground and the voltage at point 16 across resistor 19 is high enough to turn on the FET Q and thus the signal will pass from the discriminator 4 to the amplifier 6.

When the input signal level from the IF amplifier 3 supplied to the detector circuit 9 falls below a certain level the detected and rectified signal from detector-rectifier 12 will not be sufficiently large to bias transistor 13 to conduction. Thus, potential on the base of transistor 14 comes sufficiently high to turn transistor 14 on and the collector and emitter of transistor 14 substantially shorts out register 19 thus reducing the voltage at point 16 to substantially zero. This decrease in the gate potential applied to the FET Q causes the FET Q to turn off thus disconnecting the discriminator 4 from the amplifier 6 and muting occurs.

The circuit eliminates the generation of noise which is caused by the charging of the capacitor C1 upon and immediately after energization of the power source. The invention provides an excellent muting circuit and its application to radio receivers eliminates so-called pop noise.

The FET comprising the gate circuit of this invention may be either the junction or insulated-gate type and it is to be realized that the particular connection and arrangement of the resistors on the input and output sides of the gate circuit are not limited specifically to those illustrated since they are used merely by way of example.

Although the invention has been described with respect to preferred embodiments it is not to be so limited as changes and modifications may be made which are within the full intended scope of the invention as defined the appended claims.

We claim as our invention:

1. A gate circuit comprising:
   - a field effect transistor having first, second and third electrodes;
   - a signal input terminal;
   - a first capacitor connected in series with the signal path between said input terminal and said first electrode;
   - a signal output terminal connected to said second electrode;
   - means for applying a control signal to said third electrode of the field effect transistor to turn the field effect transistor off and on;
   - means for applying a first bias voltage to said second electrode of the field effect transistor; and
   - means for applying a second bias voltage to said first electrode of the field effect transistor and said means for applying said first and second bias voltages maintaining said first and second electrodes at the same direct current potential.

2. A gate circuit as claimed in claim 1 wherein said first, second and third electrodes of the field effect transistor are respectively a drain, a source and a gate.

3. A gate circuit as claimed in claim 1 wherein an impedance element is connected between said third electrode of the field effect transistor and ground.

4. A gate circuit as claimed in claim 1 wherein said first and second bias voltage applying means are respectively connected between said second electrode and a voltage source and said first electrode and said voltage source.

5. A gate circuit as claimed in claim 4 wherein both said bias voltage applying means have high impedance to a signal passing through the field effect transistor.

6. In a circuit for a radio receiver having:
   - a front end circuit supplied with an input signal of radio frequency and frequency converting the supplied signal into a signal of intermediate frequency;
   - an intermediate-frequency amplifier;
   - a demodulator for demodulating the output of said intermediate-frequency amplifier;
   - a signal output circuit connected to said demodulator;
   - a first capacitor connected in series with the signal path and to said signal output circuit;
   - a gate circuit connected to said first capacitor and in series to a path for the signal;
   - a detecting circuit for producing a control signal in response to the level of the input signal and applying the control signal to said gate circuit, said gate circuit comprising a field effect transistor having first, second and third electrodes, said first and second electrodes connected in series with the path for the signal and said third electrode being supplied with said control signal from the detecting circuit to turn on and off the field effect transistor;
   - means for applying a first bias voltage to said second electrode of the field effect transistor; and means for applying a second bias voltage to said first electrode of the field effect transistor, and said means for applying first and second bias voltages maintaining said first and second electrodes at the same direct current potential.

7. A circuit for a radio receiver as claimed in claim 6 wherein said first, second and third electrodes of the field effect transistor are respectively a drain, a source and gate.

* * * * *